United States Patent
Takakura et al.

(10) Patent No.: US 7,234,231 B2
(45) Date of Patent: Jun. 26, 2007

(54) METHOD OF MANUFACTURING A LEAD FRAME

(75) Inventors: Hideya Takakura, Kitakatsuragi-gun (JP); Kazuo Kusuda, Shiki-gun (JP); Hiroyuki Shoji, Takaichi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 191 days.

(21) Appl. No.: 10/974,910

(22) Filed: Oct. 28, 2004

(65) Prior Publication Data

US 2005/0091842 A1 May 5, 2005

(30) Foreign Application Priority Data

Oct. 30, 2003 (JP) .............................. 2003-370744

(51) Int. Cl.
*H01R 43/00* (2006.01)
(52) U.S. Cl. .............................. 29/827; 29/29; 29/832; 29/840; 257/686
(58) Field of Classification Search ................... 29/827, 29/832, 840; 257/686
See application file for complete search history.

(56) References Cited

U.S. PATENT DOCUMENTS 5,606,182 A * 2/1997 Yoshida et al. ............... 257/99
6,590,232 B2 * 7/2003 Matsuo ......................... 257/82
2002/0020906 A1 * 2/2002 Hirasawa et al. ........... 257/686

FOREIGN PATENT DOCUMENTS

| JP | 6-132561 A | 5/1994 |
| JP | 6-350128 A | 12/1994 |
| JP | 6-237010 A | 8/2004 |

* cited by examiner

*Primary Examiner*—Carl J. Arbes
(74) *Attorney, Agent, or Firm*—Birch, Stewart, Kolasch & Birch, LLP

(57) ABSTRACT

A manufacturing method of an optical coupling device includes, preparing an elongated lead frame on which a plurality of tie bars are placed between a pair of side rails that are mutually in parallel with each other so as to orthogonally cross the tie bars, with a plurality of lead terminals being placed in a staggered form in a manner so as to orthogonally cross the tie bars, and laterally cutting the elongated lead frame to prepare a plurality of strap-shaped lead frames, in such a manner that the length of protrusion of a cut end of each of the side rails from each of the tie bars is made longer than the length of protrusion of a lead terminal from each of the tie bars.

9 Claims, 9 Drawing Sheets

Before bending

After bending

PRIOR ART

FIG. 2
Lead frame A(3)
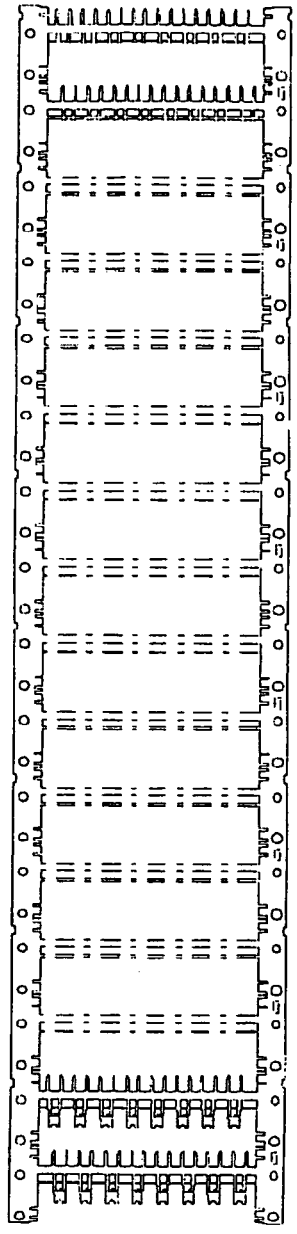
Lead frame B(3')
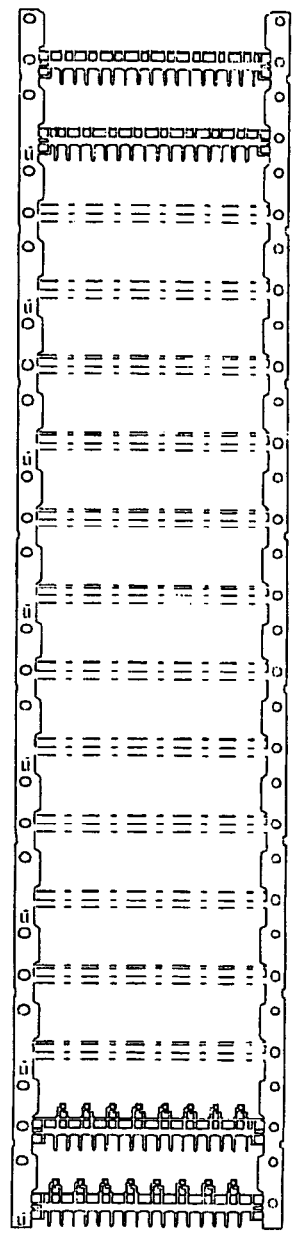
PRIOR ART

PRIOR ART

FIG. 7

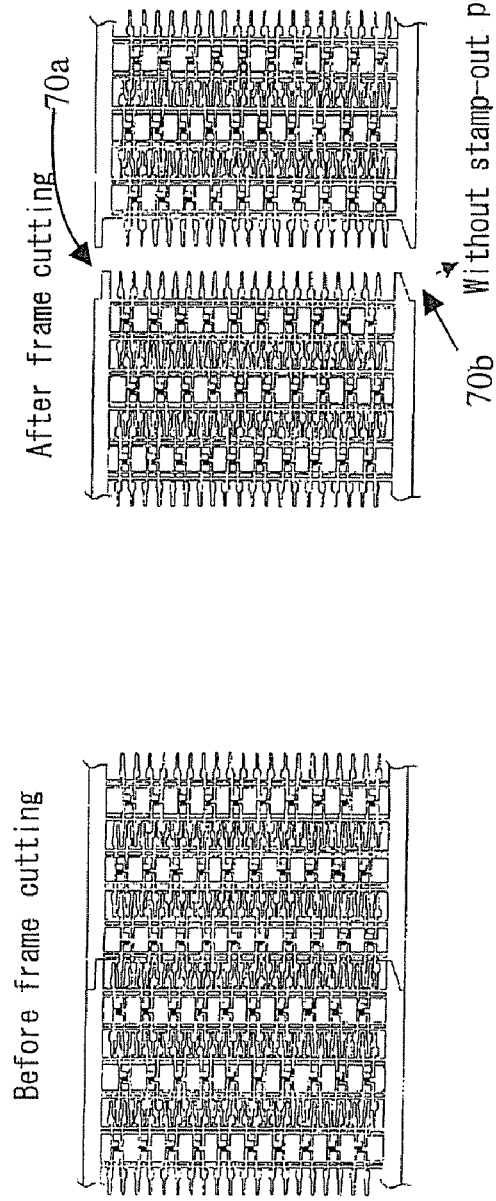

Before frame cutting

After frame cutting — 70a

70b Without stamp-out portion

By changing shape of each of side-rail cut portions as shown above, it is not necessary to cut off two rows of each of the two frame ends (corresponding to 20 pieces in this figure). Further, since cut shapes of upper and lower sides as well as right and left sides are made different, it is possible to easily carry out direction-determining process.

FIG. 8
Before frame cutting
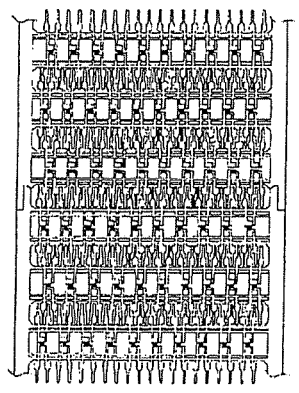
After frame cutting
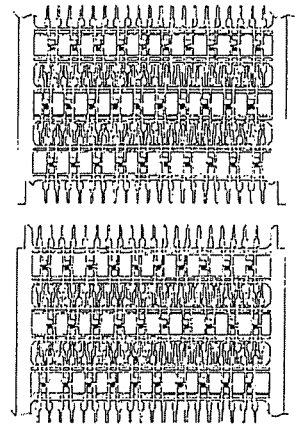
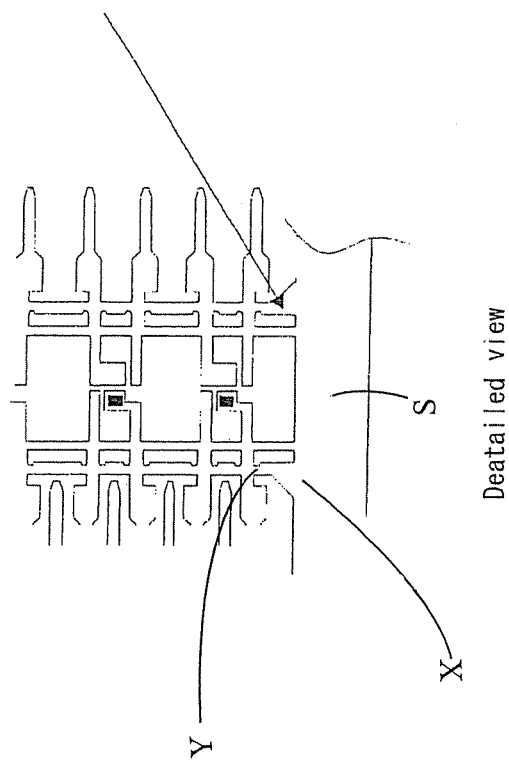
By making the base of primary tie bar wider as shown in the figure on the left, the strength is increased, making the structure less susceptible to deformation and the like.
Deatailed view FIG. 9
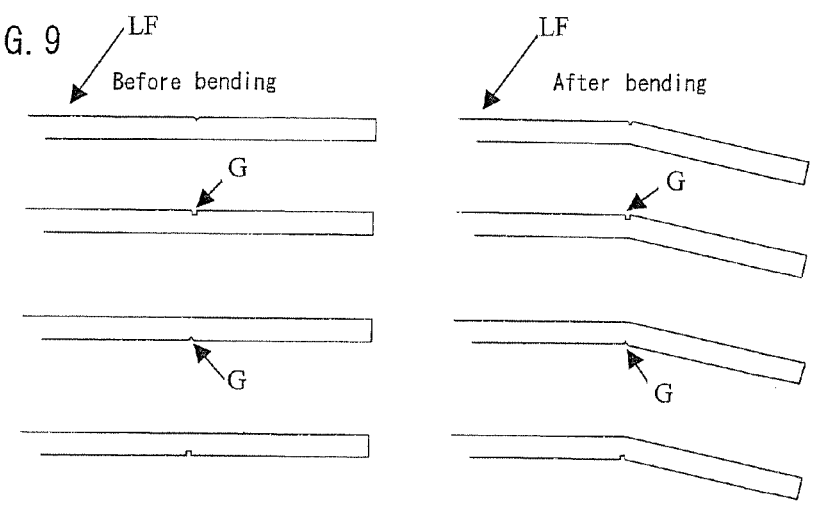
FIG. 10
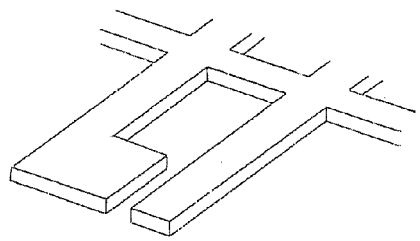
Before bending
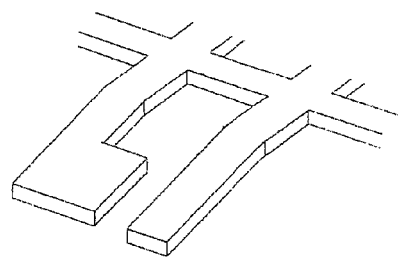
After bending
FIG. 11
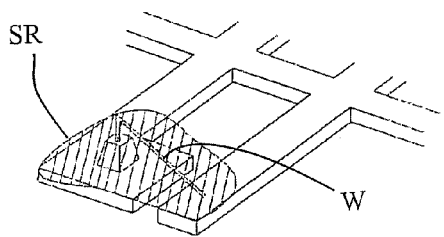
Before bending
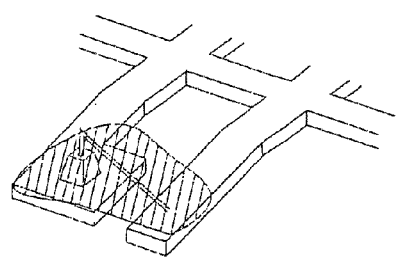
After bending

METHOD OF MANUFACTURING A LEAD FRAME

CROSS-REFERENCE TO RELATED APPLICATION

This application is related to Japanese Patent Application No. 2003-370744 filed on Oct. 30, 2003, whose priority is claimed under 35 USC § 119, the disclosure of which is incorporated by reference in its entirety.

BACKGROUND OF THE INVENTION

1. Field of the Invention

The present invention relates to a manufacturing method of a lead frame for an optical coupling device (e.g., photocoupler) that is suitably used for an electronic apparatus such as, in particular, a television and a mobile telephone; a lead frame manufactured by this method; and a manufacturing method of an optical coupling device using this lead frame.

2. Description of the Related Art

FIG. 1 shows a structure of a conventional optical coupling device, and FIG. 2 shows a lead frame to be used in the optical coupling device. The optical coupling device is manufactured by using this lead frame as follows.

A light-emitting element (1) and a light-receiving element (2) are respectively die-bonded (bonded) to a lead frame A (3) that is provided with a header on which an element is mounted and another lead frame B (3') individually. Further, wire-bonding processes in which the light-emitting element (1) and the light-receiving element (2) are connected to external leads through gold wires (4) are respectively carried out thereon, and the light-emitting element (1) is then subjected to a coating process by using a silicone resin (5) so as to alleviate stress.

Then, the two lead frames A (3) and B (3') are placed face to face with each other so as to make the optical axes of the light-emitting element (1) and the light-receiving element (2) coincident with each other. This is then subjected to a primary molding process by using a light-transmitting epoxy resin (6), and the entire portion of this that has been subjected to the primary molding process is then subjected to a transfer-molding process by using a light-shielding epoxy resin (7), that is, a secondary molding process.

The resulting product is then subjected to respective processes, such as an external plating process, a lead-forming process (external lead machining process), an insulation voltage-resistant test (insulation property test between the primary mold and the secondary mold), an electric characteristic test (measurements on various electric characteristics), a marking process, an appearance test and a packaging process; thus, a finished product is prepared.

With respect to the means for molding processes, in addition to the above-mentioned transfer-molding process, processes, such as an injection molding process and a casting process, may be used.

Moreover, as shown in FIG. 3, in the above-mentioned primary molding process, another method in which, instead of the light-transmitting epoxy resin (6), a transparent silicone resin (8) is used for forming a path between the light-emitting element (1) and the light-receiving element (2) may be used.

Examples of the prior-art techniques relating to the lead frame for optical coupling devices are disclosed in JP-A Hei 06(1994)-237010, JP-A Hei 06(1994)-350128 and JP-A Hei 06(1994)-132561.

FIG. 4 shows a manufacturing flowchart and a line block diagram of a conventional optical coupling device, which include processes from die-bonding processes of light-emitting elements and light-receiving elements, through an overlapping process, a primary molding process, a secondary molding process, an external plating process and a lead forming process, to a packing process for a finished product.

Moreover, FIG. 5 shows a manufacturing method of a conventional lead frame.

First, a metal material (Cu material, Fe material or the like), wound into a coil, is prepared, and this is stamped by using a stamping metal mold so that an element mounting header is formed. Further, the header portion and the wire-bond $2^{nd}$ portion are subjected to a plating process, and the header portion is then bent over, and cut out into straps with a specified length.

In general, the manufacturing processes are carried out in the above-mentioned sequence; however, after the plating process has been first carried out, the processes such as stamping, bending and strap-shape cutting processes may be then carried out, or the processes such as stamping, bending, plating and strap-shape cutting processes may be carried out in this order.

Upon using the lead frame obtained as described above, a lead frame on which a light-emitting element is mounted and a lead frame on which a light-receiving element is mounted are required, and since these elements need to be die-bonded and wire-bonded respectively, independent transport systems are respectively required on the light-emitting element side as well as on the light-receiving element side (see line structural diagram of FIG. 4).

For this reason, a wide installation space is required in the manufacturing line, causing high costs of equipment. Moreover, with respect to the lead frame manufacturing processes, since two lead frames are required on the light-emitting element side as well as on the light-receiving element side, two dies (trimming dies) used for manufacturing the lead frames are required, resulting in high lead frame manufacturing costs as well as high material and die costs.

In recent years, the price competition of electronic components has been intensified, and in response to this circumstance, it is indispensable to reduce fixed costs such as equipment service costs in addition to variable costs such as material costs. Further, proposed countermeasures are material use with high efficiency (reduction of material costs per one electronic component), reduction in facility costs by improvements in the facility and reduction in facility costs by simplifying the facility structure.

Recently, a plane mounted optical coupling element in which light-emitting elements and light-receiving elements are integrally formed into one piece and flatly mounted on the lead frame has also been developed.

However, although such a plane mounted optical coupling element has advantages in that the lead frame price and costs required for transport-system facilities are reduced, it has a structure that tends to cause a lead deformation upon cutting a lead frame due to limitations in the manufacturing process.

SUMMARY OF THE INVENTION

It is therefore an object of the present invention to provide a manufacturing method of a lead frame that can reduce manufacturing costs, is less susceptible to lead deformation upon cutting a lead frame, and prevents wasteful use of materials upon strap-shape cutting; a lead frame manufactured by this method; and a manufacturing method of an optical coupling device using this lead frame.

In accordance with one aspect of the present invention, provided is a manufacturing method of a lead frame for an optical coupling device, comprising the steps of: preparing an elongated lead frame on which a plurality of tie bars are placed between a pair of side rails that are mutually in parallel with each other so as to orthogonally cross the bars, with a plurality of lead terminals being placed in a staggered form in a manner so as to orthogonally cross the tie bars; and laterally cutting the elongated lead frame to prepare a plurality of strap-shaped lead frames, wherein the elongated lead frame is cut in such a manner that the length of protrusion of a cut end of each of the side rails from each of the tie bars is made longer than the length of protrusion of a lead terminal from each of the tie bars.

In accordance with this manufacturing method, since the light-emitting element and the light-receiving element are integrally formed into one piece and flatly mounted on a lead frame, it becomes possible to reduce manufacturing costs. Further, since the elongated lead frame is cut in a manner so as to make the length of protrusion of the cut end of each of side rails from the tie bar longer than the length of protrusion of the lead terminal from the tie bar, this structure is less susceptible to lead deformation upon cutting a lead frame, and makes it possible to prevent wasteful use of materials upon strap-shape cutting.

BRIEF DESCRIPTION OF THE DRAWINGS

FIG. 2 is a diagram that shows a lead frame for the optical coupling device of FIG. 1;

FIG. 7 is a schematic view that shows a strap-shape cutting process of a lead frame for a plane mounted optical coupling device in accordance with a second embodiment of the present invention;

FIG. 8 is a schematic view that shows a strap-shape cutting process of a lead frame for a plane mounted optical coupling device in accordance with a third embodiment of the present invention;

FIG. 9 is a schematic view that shows a bending model of a lead frame for a plane mounted optical coupling device in accordance with a fourth embodiment of the present invention;

FIG. 10 is a schematic view that shows a bending model of a lead frame for a plane mounted optical coupling device in accordance with a fifth embodiment of the present invention; and FIG. 11 is a schematic view that shows a bending model of a lead frame for a plane mounted optical coupling device in accordance with a sixth embodiment of the present invention.

DETAILED DESCRIPTION OF THE INVENTION

Figure 1:
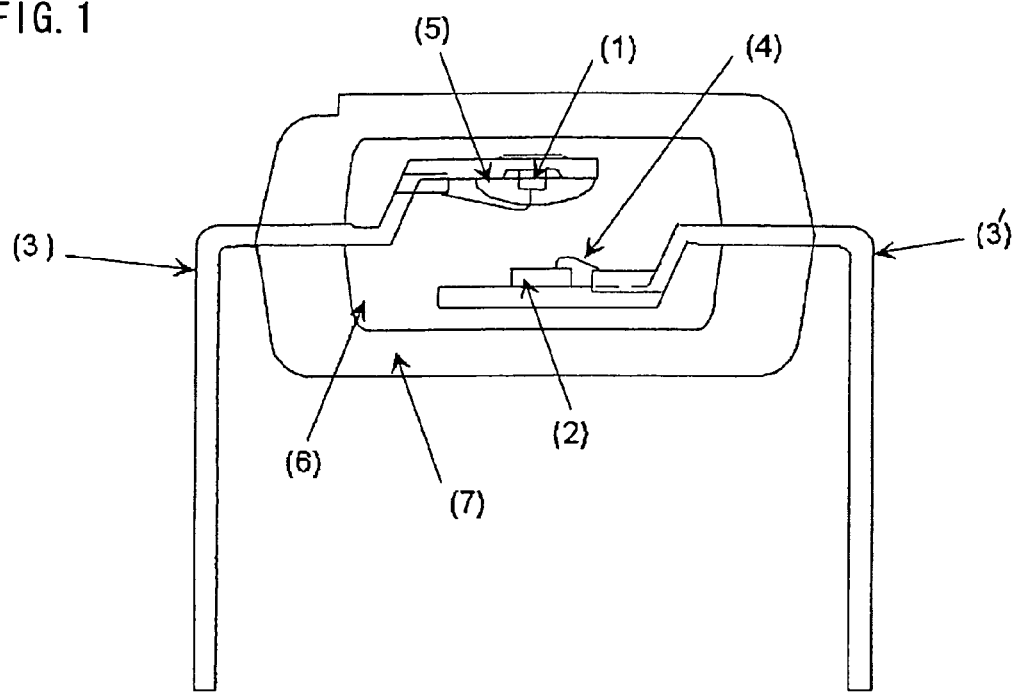
FIG. 1 is a structural diagram that shows a conventional optical coupling device.
Figure 3:
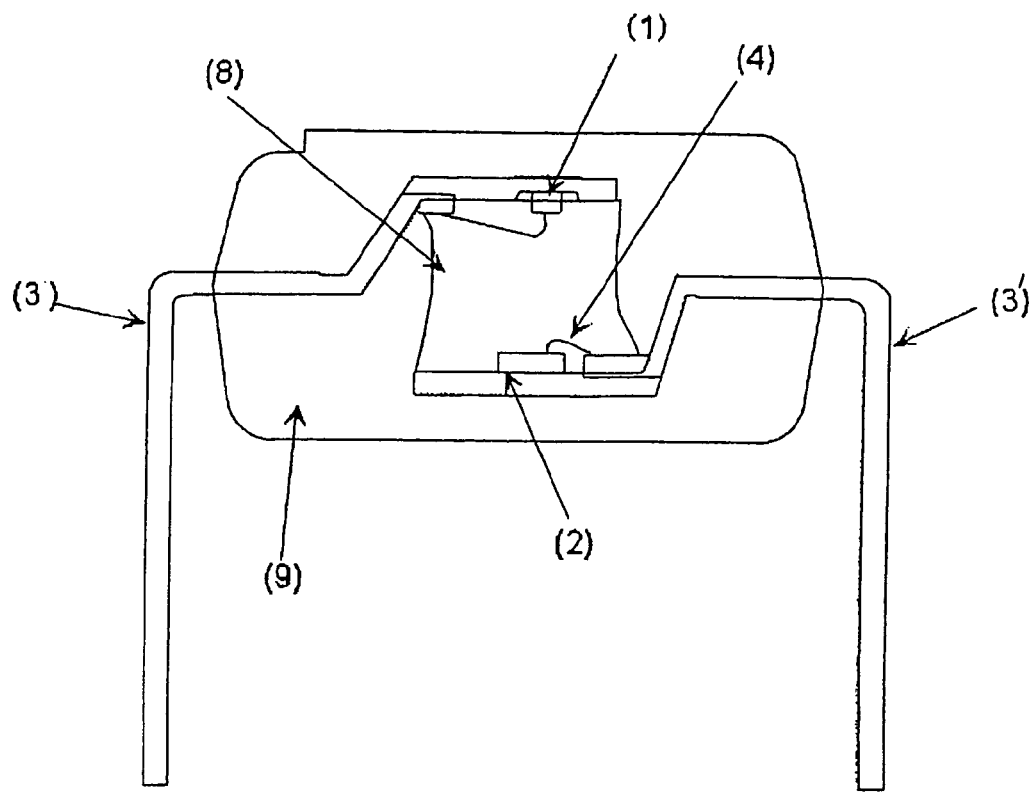
FIG. 3 is a structural diagram that shows another conventional optical coupling device.
Figure 4:
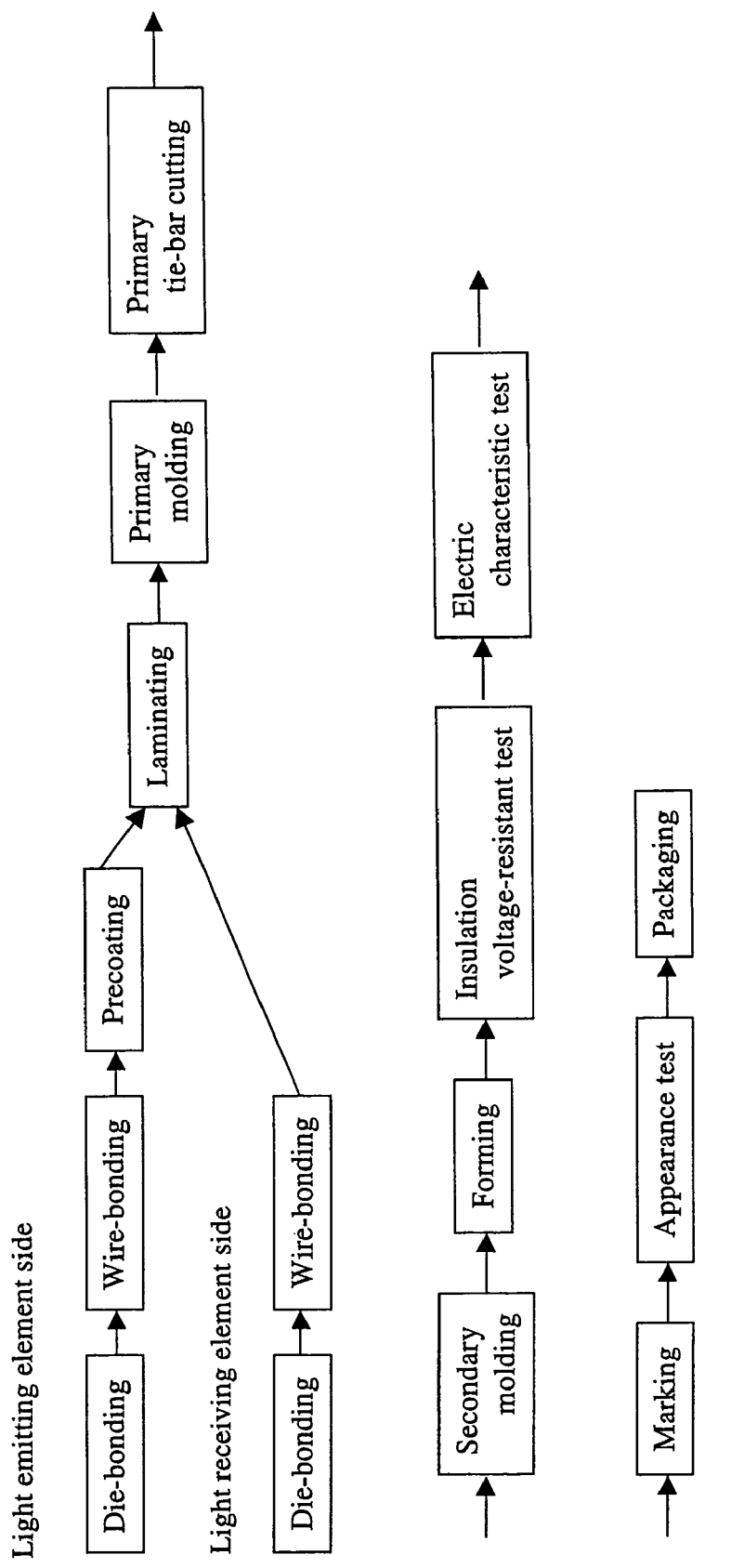
FIG. 4 is a block diagram that shows a manufacturing flow chart and a line structure of the conventional optical coupling device.
Figure 5:
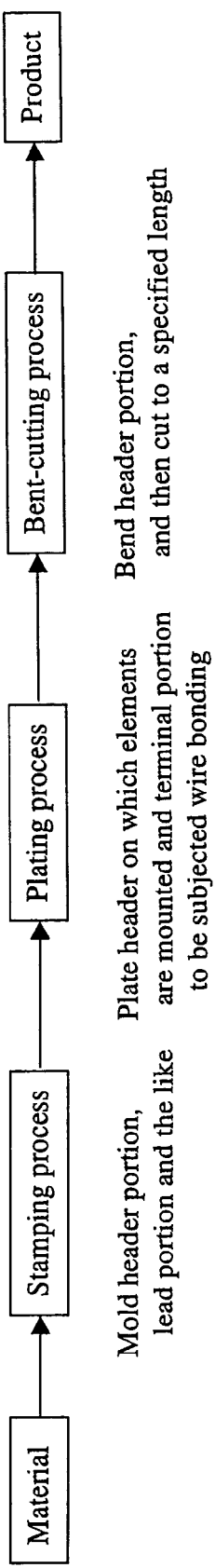
FIG. 5 is a diagram that shows manufacturing processes of a conventional lead frame.

In the manufacturing method in accordance with the one aspect, preferably, the elongated lead frame is cut further in such a manner that the shapes in top plan of cut ends of the side rails to be made face to face with each other after the cutting are made different from each other.

In the case where the elongated lead frame is cut in this manner, since the shapes in top plan of the two cut ends (e.g., right and left cut ends) of the respective side rails are made different from each other, the orientation of the strap-shaped lead frame (e.g., right and left sides) can be recognized, so that a direction-determining process is easily carried out.

In the manufacturing method in accordance with the one aspect, preferably, the elongated lead frame is cut further in such a manner that the shape in top plan of a cut end of one of the side rails is made different from the shape in top plan of the corresponding cut end of the other side rail.

By cutting the elongated lead frame as described above, since the shapes in top plan of the two cut ends in an up and down pair of side rails or a front and rear pair of side rails are made different from each other, the up and down sides or the front and rear sides of the strap-shaped lead frame can be recognized, so that a direction-determining process is easily carried out.

In the manufacturing method in accordance with the one aspect, preferably, the elongated lead frame is cut further in such a manner that the width of the end of a tie bar connected to each of the side rails is made wider than the width of the other portion of the tie bar.

In the case where the elongated lead frame is cut in this manner, since the strength of the tie bar at the side rail end is made greater than the strength of the other portion thereof, this structure is less susceptible to tie bar deformation, and consequently becomes less susceptible to lead deformation.

In accordance with another aspect of the present invention, provided is a strap-shaped lead frame, which is formed by cutting an elongated lead frame in accordance with the manufacturing method according to the one aspect.

In accordance with the strap-shaped lead frame of this type, since the light-emitting element and the light-receiving element are integrally formed into one piece and flatly mounted on a lead frame, it becomes possible to reduce manufacturing costs. Further, since the elongated lead frame is cut in a manner so as to make the length of protrusion of the cut end of each of side rails from the tie bar longer than the length of protrusion of the lead terminal from the tie bar, this structure is less susceptible to lead deformation, and makes it possible to prevent wasteful use of materials.

In accordance with a third aspect of the present invention, provided is a manufacturing method of an optical coupling device, comprising the steps of: mounting a semiconductor element on the strap-shaped lead frame according to the another aspect; and sealing the resultant with a resin.

In accordance with this manufacturing method, since the light-emitting element and the light-receiving element are integrally formed into one piece and flatly mounted on a lead frame, it becomes possible to reduce manufacturing costs. Further, since the elongated lead frame is cut in a manner so as to make the length of protrusion of the cut end of each of side rails from the tie bar longer than the length of protrusion of the lead terminal from the tie bar, this structure is less susceptible to lead deformation, and makes it possible to prevent wasteful use of materials.

In accordance with a fourth aspect of the present invention, provided is a manufacturing method of an optical coupling device, comprising the steps of: mounting a light-emitting element and a light-receiving element on the strap-shaped lead frame according to the another aspect; bending the tip of the lead frame mounting thereon the light-emitting element and the light-receiving element from an upper face side toward a lower face side with an obtuse angle; and sealing the light-emitting element and the light-receiving element with a resin.

In accordance with this manufacturing method, since the light-emitting element and the light-receiving element are integrally formed into one piece and flatly mounted on a lead frame, it becomes possible to reduce manufacturing costs. Further, since the elongated lead frame is cut in a manner so as to make the length of protrusion of the cut end of each of side rails from the tie bar longer than the length of protrusion of the lead terminal from the tie bar, this structure is less susceptible to lead deformation, and makes it possible to prevent wasteful use of materials. Moreover, since the tip of the lead frame is bent from the upper surface side toward the lower surface side with an obtuse angle, the lead is easily bent at the time of a primary molding process.

In the manufacturing method in accordance with the fourth aspect, preferably, a groove is preliminarily formed at a portion along which the lead frame is bent so that the thickness of the lead frame at the portion is made thinner.

By preliminarily forming such a groove, it becomes possible to more easily bend the lead at the time of a primary molding process.

In the manufacturing method in accordance with the fourth aspect, preferably, the lead frame is bent with the tie bars being connected thereto.

By bending the tie bar in this manner, it is possible to evenly form bends on the header side and the wire-bond $2^{nd}$ side, so that it becomes possible to make the element connecting wire less susceptible to deformation.

In the manufacturing method in accordance with the fourth aspect, preferably, the resin sealing process is carried out in such a manner that the light-emitting element, the light-receiving element and the element connecting wire are entirely sealed with a silicone resin.

With this sealing process, since the entire wire portions are coated with the silicone resin serving as precoat resin, it becomes possible to alleviate stress imposed on the wires.

In accordance with the present invention, it is possible to obtain a lead frame that can reduce manufacturing costs, is less susceptible to lead deformation at the time of cutting a lead frame, and prevents wasteful use of materials upon strap-shaped cutting; and an optical coupling element using such a lead frame.

Referring to the drawings, description will be given of preferred embodiments of the present invention.

First Embodiment

Figure 6:
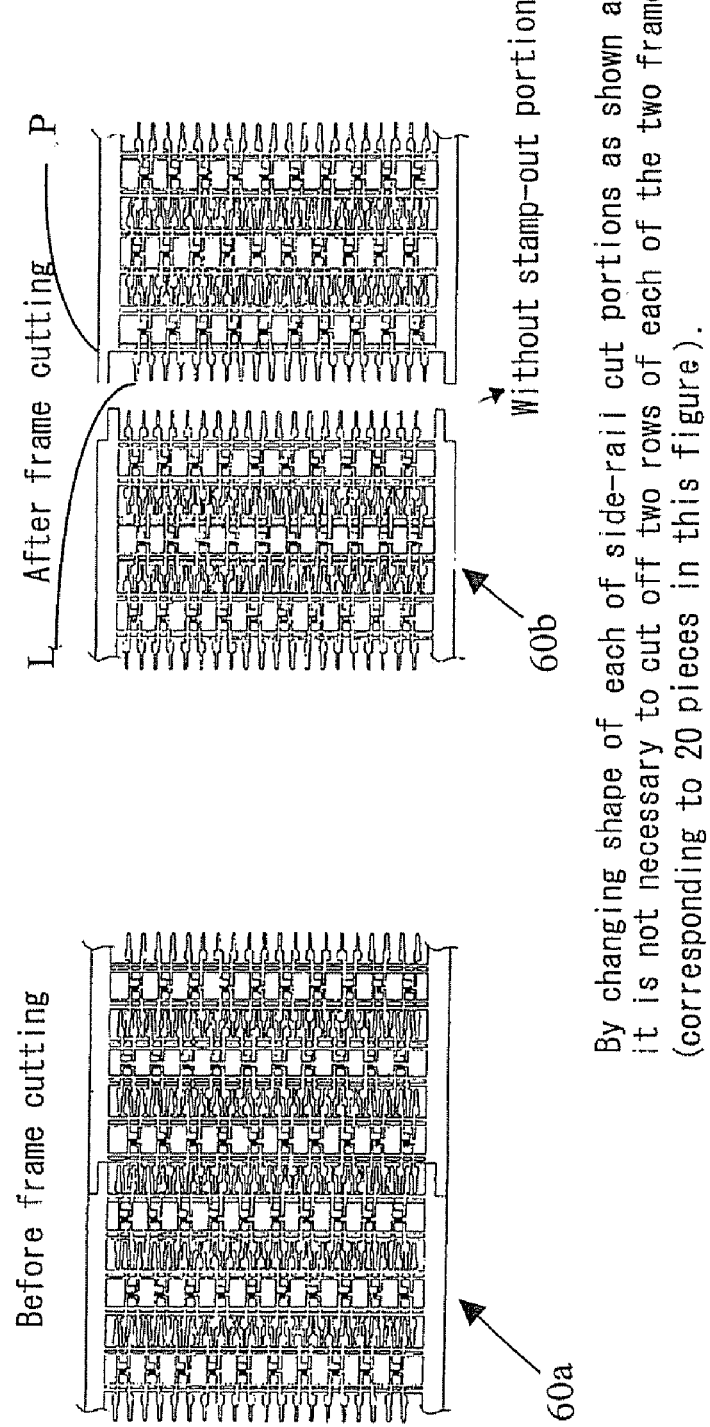
FIG. 6 is a schematic view that shows a strap-shape cutting process of a lead frame for a plane mounted optical coupling device in accordance with a first embodiment of the present invention.

FIG. 6 is a diagram that shows a manufacturing process of a lead frame for a plane mounted optical coupling device in accordance with a first embodiment of the present invention.

In the case where an elongated lead frame 60a, shown on the left half portion in FIG. 6, is divided (cut) into a strap-shaped lead frame 60b shown on the right half portion, the elongated lead frame is cut so that the length of protrusion P of the cut end from the tie bar of each of a pair of front and rear side rails is made longer than the length of protrusion L of the lead terminal from the tie bar. With this arrangement, the length of protrusion P of the cut end from the tie bar of each of the side rails is made longer than the length of protrusion L of the lead terminal; therefore, the lead terminal is protected by the protrusion of the side rail, and becomes less susceptible to lead deformation.

Moreover, the elongated lead frame is cut in a manner so as to make the shapes in top plan of right and left cut ends of the side rails, to be made face to face with each other after the cutting, different from each other; therefore, the right and left sides of the strap-shaped lead frame can be recognized, making it possible to easily carry out a direction determining process.

Second Embodiment

FIG. 7 is a diagram that shows a manufacturing process of a lead frame for a plane mounted optical coupling element in accordance with a second embodiment.

In this embodiment, in addition to the arrangement of the first embodiment, the elongated lead frame is cut in such a manner that the shape 70a in top plan of a cut end of one (front side) of side rails and the shape 70b in top plan of the corresponding cut end of the other side rail (rear side) are made different from each other. Therefore, the right and left sides as well as the front and rear sides of the strap-shaped lead frame can be recognized so that not only a right/left direction determination, but also a front/rear direction determination can be easily made.

Third Embodiment

FIG. 8 is a diagram that shows a manufacturing process of a lead frame for a plane mounted optical coupling element in accordance with a third embodiment.

In this embodiment, the width X of the end of a tie bar (primary tie bar) that is connected to each side rail S is made larger than the width Y of the other portion of the tie bar, that is, as shown in a detailed view in FIG. 8, the enlarged lead frame is cut so that the side-rail connecting portion (base portion) of the tie bar is made wider.

With this arrangement, the strength of the end of the tie bar becomes greater than the strength of the other portions, so that it is possible to make the tie bar less susceptible to deformation, and consequently to make the lead less susceptible to deformation.

Fourth Embodiment

FIG. 9 is a detailed view that shows a manufacturing process of a lead frame for a plane mounted optical coupling element in accordance with a fourth embodiment.

In this embodiment, prior to bending the tip of the lead frame LF mounting thereon light-emitting elements and light-receiving elements from the upper face side toward the lower face side with an obtuse angle, a groove G having a V-shape or a U-shape in its cross section is preliminarily formed at the corresponding portion (upper face or lower face) along which the lead frame is bent. With this arrangement, the thickness of the lead frame at the corresponding portion is made thinner, so that the lead bending process at the time of primary molding is easily carried out.

Fifth Embodiment

FIG. 10 is a diagram that shows a bending model of a lead frame for a plane mounted optical coupling element in accordance with a fifth embodiment.

In this embodiment, the lead frame is bent with tie bars being connected thereto. In the case where the lead frame is bent in this manner, it is possible to evenly form bends on the header side and the wire-bond $2^{nd}$ side, so that it becomes possible to make the element connecting wire less susceptible to deformation.

Sixth Embodiment

FIG. 11 is a diagram that shows a bending model of a lead frame for a plane mounted optical coupling element in accordance with a sixth embodiment.

In this embodiment, a light-emitting element, a light-receiving element and an element connecting wire (gold wire) W are entirely sealed with a silicone resin SR. With this sealing process, since the entire wire portion is coated with the silicone resin serving as precoat resin, it becomes possible to alleviate stress imposed on the wire.

What is claimed is:

1. A manufacturing method of an optical coupling device, comprising:

preparing an elongated lead frame on which a plurality of tie bars are placed between a pair of side rails that are mutually in parallel with each other so as to orthogonally cross the tie bars, with a plurality of lead terminals being placed in a staggered form in a manner so as to orthogonally cross the tie bars; and laterally cutting the elongated lead frame to prepare a plurality of strap-shaped lead frames, in such a manner that the length of protrusion of a cut end of each of the side rails from each of the tie bars is made longer than the length of protrusion of a lead terminal from each of the tie bars.

2. A manufacturing method of an optical coupling device, comprising:

preparing an elongated lead frame on which a plurality of tie bars are placed between a pair of side rails that are mutually in parallel with each other so as to orthogonally cross the tie bars, with a plurality of lead terminals being placed in a staggered form in a manner so as to orthogonally cross the tie bars;

laterally cutting the elongated lead frame to prepare a plurality of strap-shaped lead frames, in such a manner that the length of protrusion of a cut end of each of the side rails from each of the tie bars is made longer than the length of protrusion of a lead terminal from each of the tie bars;

mounting a semiconductor element on a said strap-shaped lead frame; and sealing the resultant with a resin.

3. The manufacturing method according to claim 2, wherein the elongated lead frame is cut further in such a manner that the shapes in top plan of cut ends of the side rails to be made face to face with each other after the cutting are made different from each other.

4. The manufacturing method according to claim 2, wherein the elongated lead frame is cut further in such a manner that the shape in top plan of a cut end of one of the side rails is made different from the shape in top plan of the corresponding cut end of the other side rail.

5. The manufacturing method according to claim 2, wherein the elongated lead frame is cut further in such a manner that the width of the end of a tie bar connected to each of the side rails is made wider than the width of the other portion of the tie bar.

6. A manufacturing method of an optical coupling device, comprising:

preparing an elongated lead frame on which a plurality of tie bars are placed between a pair of side rails that are mutually in parallel with each other so as to orthogonally cross the tie bars, with a plurality of lead terminals being placed in a staggered form in a manner so as to orthogonally cross the tie bars;

laterally cutting the elongated lead frame to prepare a plurality of strap-shaped lead frames, in such a manner that the length of protrusion of a cut end of each of the side rails from each of the tie bars is made longer than the length of protrusion of a lead terminal from each of the tie bars;

mounting a light-emitting element and a light-receiving element on a said strap-shaped lead frame;

bending a tip of the lead frame, mounting thereon the light-emitting element and the light-receiving element, downward to form an obtuse angle with respect to the tie bars; and sealing the light-emitting element and the light-receiving element with a resin.

7. The manufacturing method according to claim 6, further comprising:

forming a groove preliminary a portion along which the lead frame is bent so that the thickness of the lead frame at the portion is made thinner.

8. The manufacturing method according to claim 6, further comprising:

bending the lead frame with the tie bars being connected thereto.

9. The manufacturing method according to claim 6, wherein the sealing step is carried out in such a manner that the light-emitting element, the light-receiving element and the element connecting wire are entirely sealed with a silicone resin.

* * * * *